United States Patent
Endo

(10) Patent No.: US 10,599,254 B2
(45) Date of Patent: Mar. 24, 2020

(54) SEMICONDUCTOR DEVICE FOR DISTRIBUTING A REFERENCE VOLTAGE

(71) Applicant: Synaptics Japan GK, Tokyo (JP)

(72) Inventor: Kazuya Endo, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 150 days.

(21) Appl. No.: 15/818,422

(22) Filed: Nov. 20, 2017

(65) Prior Publication Data

US 2018/0074647 A1 Mar. 15, 2018

Related U.S. Application Data

(63) Continuation of application No. 14/491,994, filed on Sep. 20, 2014, now Pat. No. 9,846,504.

(30) Foreign Application Priority Data

Sep. 30, 2013 (JP) ................. 20130203582

(51) Int. Cl.
*G06F 3/041* (2006.01)
*G11C 5/14* (2006.01)
*G09G 3/36* (2006.01)

(52) U.S. Cl.
CPC ............. *G06F 3/0416* (2013.01); *G09G 3/36* (2013.01); *G09G 3/3696* (2013.01); *G11C 5/147* (2013.01); *G09G 2310/0289* (2013.01); *G09G 2310/0294* (2013.01)

(58) Field of Classification Search
None
See application file for complete search history.

(56) References Cited

U.S. PATENT DOCUMENTS

| 5,414,443 A | 5/1995 | Kanatani et al. | |
| 5,731,795 A * | 3/1998 | Kanda | G09G 3/3633 345/87 |
| 6,243,066 B1 * | 6/2001 | Murakami | G09G 3/2011 345/205 |
| 6,628,261 B1 * | 9/2003 | Sato | G09G 3/3685 345/100 |

(Continued)

FOREIGN PATENT DOCUMENTS

| CN | 101630533 A | 1/2010 |
| CN | 101667385 A | 3/2010 |

(Continued)

*Primary Examiner* — David D Davis
(74) *Attorney, Agent, or Firm* — Patterson + Sheridan, LLP

(57) ABSTRACT

In a semiconductor device in which a reference voltage is generated by a reference voltage generation circuit, and the same reference voltage generated is used in a plurality of circuit units for the purpose of generating a voltage, a sampling and holding circuit of the reference voltage is provided in order to provide a standard voltage to the circuit units. A sampling and holding control circuit that controls the sampling and holding circuit instructs the sampling and holding circuit to perform a sampling operation of the reference voltage in case that the semiconductor device operates in a state where power supply noise of the reference voltage generation circuit falls within a predetermined range, and instructs the sampling and holding circuit to perform a holding operation of the reference voltage in case that the semiconductor device operates in a state where the power supply noise exceeds the predetermined range.

10 Claims, 11 Drawing Sheets

(56) References Cited

U.S. PATENT DOCUMENTS

| | | | |
|---|---|---|---|
| 2003/0201991 A1* | 10/2003 | Goto | G09G 3/3648 345/211 |
| 2005/0007334 A1* | 1/2005 | Park | G09G 3/36 345/102 |
| 2005/0212528 A1 | 9/2005 | Kajita | |
| 2007/0063957 A1* | 3/2007 | Awakura | G02F 1/13318 345/98 |
| 2010/0327841 A1 | 12/2010 | Ito et al. | |
| 2011/0025346 A1 | 2/2011 | Kajita | |
| 2012/0287081 A1* | 11/2012 | Akai | G06F 3/044 345/174 |
| 2013/0016091 A1* | 1/2013 | Kato | G09G 3/3225 345/419 |
| 2013/0082915 A1* | 4/2013 | Nakagawa | G09G 3/3688 345/92 |
| 2015/0091888 A1* | 4/2015 | Min | G09G 3/3291 345/212 |

FOREIGN PATENT DOCUMENTS

| | | |
|---|---|---|
| CN | 101751898 A | 6/2010 |
| CN | 102202187 A | 9/2011 |
| CN | 102376275 A | 3/2012 |
| CN | 102971782 A | 3/2013 |
| CN | 103150990 A | 6/2013 |
| JP | 2003316328 A | 11/2003 |
| JP | 2005249408 A | 9/2005 |
| WO | WO-03021567 A1 | 3/2003 |

* cited by examiner

SEMICONDUCTOR DEVICE FOR DISTRIBUTING A REFERENCE VOLTAGE

CROSS-REFERENCE TO RELATED APPLICATIONS

This application is a continuation of U.S. application Ser. No. 14/491,994 filed Sep. 20, 2014 which claims priority from Japanese application JP 2013-203582 filed on Sep. 30, 2013, the content of which is hereby incorporated by reference into this application.

BACKGROUND

The present invention relates to a technique for mitigating the influence of a fluctuation in reference voltage caused by power supply noise to a semiconductor device which is used by distributing a reference voltage. For example, from one reference voltage generation circuit to a plurality of circuits having different power supplies. Particularly, to a technique effective in a case of application to an LCD (Liquid Crystal Display) controller LSI (Large Scale Integrated circuit) and the like that drive a liquid crystal display panel.

In case that a plurality of circuit s circuits that generate a signal of a desired voltage using the reference voltage are included, the common use of the reference voltage generation circuit with respect to the plurality of circuits allows not only the number of reference voltage generation circuits but also the number of trimming circuits to be reduced, which can result in contributing to a reduction in the scale of the plurality of circuits. For example, an LCD controller LSI for driving a liquid crystal display panel includes a circuit that generates a common electrode driving voltage of the liquid crystal display panel to drive a common electrode, a circuit that generates a source electrode driving voltage of the liquid crystal display panel to drive a source electrode, a circuit that generates a voltage for the driving and touch detection of a touch panel to control the touch panel, and the like, and these circuits generate required voltages using a reference voltage. JP-A-2003-316328 discloses an LCD controller LSI that generates such a common electrode driving voltage and a source electrode driving voltage using a reference voltage.

SUMMARY

For an LCD controller LSI, in the case that a reference voltage generated by one reference voltage generation circuit is supplied to a circuit that generates a common electrode driving voltage of the liquid crystal display panel to drive a common electrode, a circuit that generates a source electrode driving voltage of the liquid crystal display panel to drive a source electrode, a circuit that generates a voltage for the driving and touch detection of a touch panel to control the touch panel, and the like, the inventor has found the following problems.

For example, in the LCD controller LSI, in case that a circuit that drives a common electrode, a circuit that drives a source electrode, and a circuit that controls a touch panel are individually provided with a reference voltage generation circuit, power supply noise generated in one circuit is not likely to have a direct influence on the reference voltage generation circuits of other circuits. However, in case that the reference voltage supplied to the circuit that drives a common electrode, the circuit that drives a source electrode, and the circuit that controls a touch panel fluctuates, a display state becomes disordered due to an influence on the entirety of the circuits, and touch detection accuracy deteriorates. Particularly, in case that attention is focused on the power supply noise of the reference voltage generation circuit as a fluctuation in reference voltage, the reference voltage fluctuates due to operations of circuits using the same power supply. In case that such a power supply fluctuation occurs in asynchronization with a display timing, the disorder of display occurs randomly and locally with respect to a display screen, and a display quality deteriorates significantly. The term "power supply noise" as used herein refers to power supply fluctuation noise generated by a consumption current of a circuit element flowing through a power supply path of a substrate or a package, and includes IR drop, ground bounce and the like. The influence of such power supply noise is substantially similar to not only a case where the respective power supplies are independent from each other as external power supplies, but also a case where some internal power supplies attempted to be generated by boosting power supplies provided from the outside are allocated to these circuits.

The above and other problems and novel features will be made clearer from the description and the accompanying drawings of the specification.

The following is a brief description of the summary of the representative embodiments of the invention disclosed in the application.

That is, in a semiconductor device in which a reference voltage is generated by a reference voltage generation circuit, and the same reference voltage generated is used in a plurality of circuit units for the purpose of generating a voltage, a sampling and holding circuit of the reference voltage is provided in order to provide a standard voltage to the circuit units. A sampling and holding control circuit that controls the sampling and holding circuit instructs the sampling and holding circuit to perform a sampling operation of the reference voltage in case that the semiconductor device operates in a state where power supply noise of the reference voltage generation circuit falls within a predetermined range, and instructs the sampling and holding circuit to perform a holding operation of the reference voltage in case that the semiconductor device operates in a state where the power supply noise exceeds the predetermined range.

The following is a brief description of an effect obtained by the representative embodiments of the invention disclosed in the application.

That is, it is possible to suppress an adverse influence on a plurality of circuit units due to a reference voltage fluctuated by power supply noise.

DETAILED DESCRIPTION

Summary of the Embodiments

Figure 1:
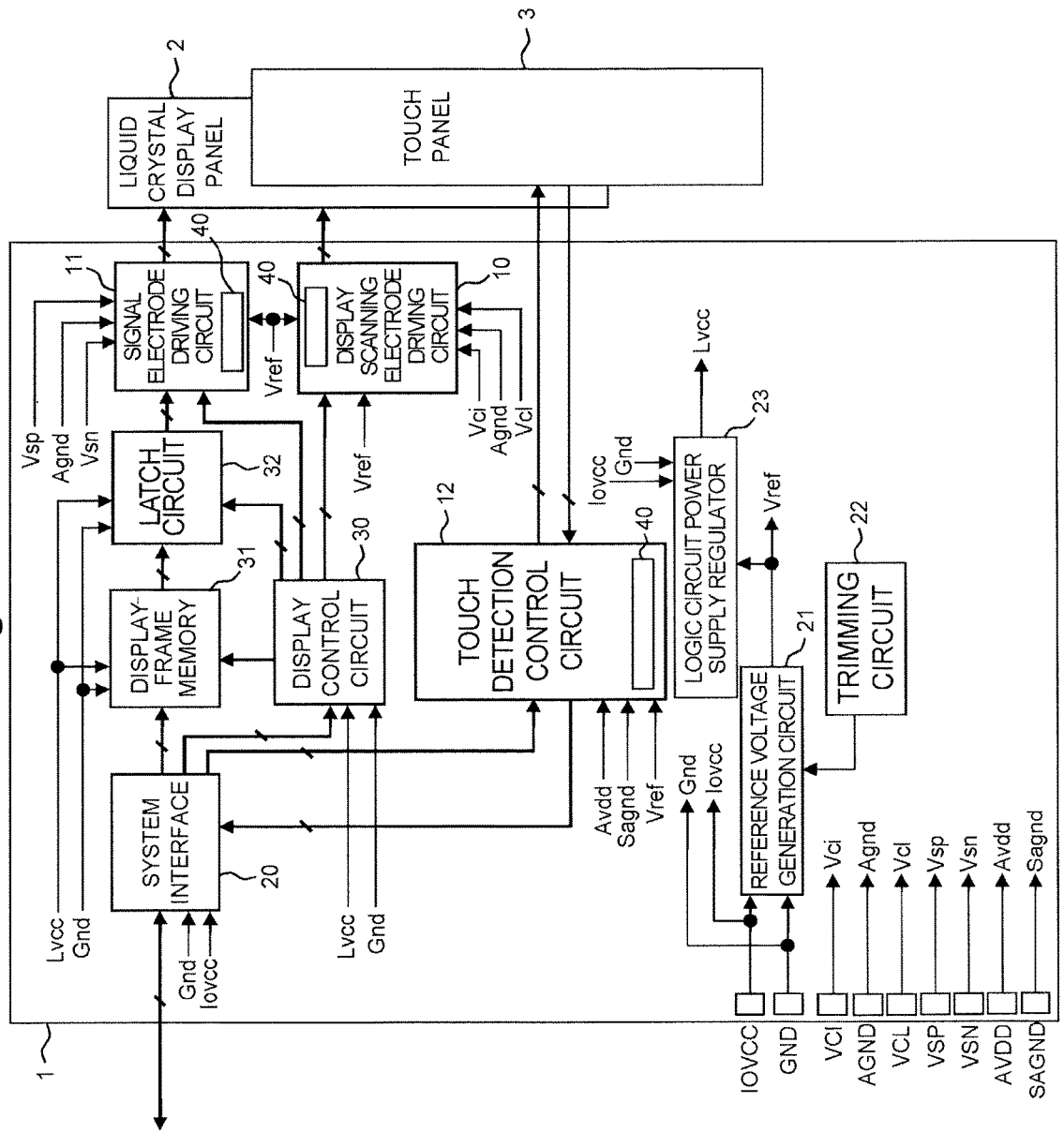
FIG. 1 is a block diagram illustrating an LCD controller LSI which is an example of a semiconductor device.

First, summary of representative embodiments of the invention disclosed in the application will be described. Reference numerals in drawings in parentheses referred to in description of the summary of the representative embodiments just denote components included in the concept of the components to which the reference numerals are designated.
Sampling and Holding of Reference Voltage A semiconductor device (1, 1A) includes a first circuit unit (20, 30, 31, 32), a reference voltage generation circuit (21) that generates a reference voltage (Vref), a sampling and holding circuit (40) of the reference voltage, a sampling and holding control circuit (60, 70, 70A) that controls the sampling and holding circuit, and a plurality of second circuit units (10cct, 11cct, and 12cct) that operate by inputting the reference voltage sampled and held by the sampling and holding circuit. The sampling and holding control circuit instructs the sampling and holding circuit to perform a sampling operation of the reference voltage in case that the semiconductor device operates in a state where power supply noise of the reference voltage generation circuit falls within a predetermined range, and instructs the sampling and holding circuit to perform a holding operation of the reference voltage in case that the semiconductor device operates in a state where the power supply noise exceeds a predetermined range.

According to this, in case that the power supply noise of the reference voltage generation circuit does not fall within a predetermined range, the sampling and holding circuit holds the reference voltage before fluctuation. Thereby, the second circuit units can continuously use the reference voltage before fluctuation due to the power supply noise of the reference voltage generation circuit. Therefore, it is possible to suppress an adverse influence on the second circuit units due to the reference voltage fluctuated by the power supply noise. In addition, since the plurality of second circuit unit s are not required to be individually provided with the reference voltage generation circuit, it is possible to reduce the time and effort of a reduction in the scale of the circuit and trimming adjustment for the reference voltage generation circuit.
Use of a Plurality of Power Supplies In paragraph 1, the reference voltage generation circuit uses a first power supply (lovcc), the first circuit unit uses the first power supply (lovcc) or a power supply (Lvcc) obtained by stepping down the first power supply, and the second circuit units use a second power supply (Vci, Vcl, Vsp, Vsn) having a volt age higher than that of the first power supply in absolute value.

According to this, even in case that the reference voltage gene rated by a low-potential power supply is used in the second circuit units operating by a high-potential power supply, the influence of a fluctuation in reference voltage is suppressed similarly. The first power supply and the second power supply may be external power supplies which are individually provided from the outside of the semiconductor device, and the second power supply may be a power supply formed by boosting the first power supply, provided from the outside of the semiconductor device, in the inside of the semiconductor device.
Sampling and Holding Control by Detecting Power Supply Noise Vref In paragraph 2, the sampling and holding control circuit (60) determines whether a predetermined power supply fluctuation occurs in a power supply of the reference voltage generation circuit, instructs the sampling and holding circuit to perform the holding operation of the reference voltage in a period determined by a predetermined time constant with respect to the fluctuation in case that the predetermined power supply fluctuation is detected, and instructs the sampling and holding circuit to perform the sampling operation of the reference voltage in case that the power supply fluctuation is not detected.

According to this, it is possible to perform sampling and holding control by directly ascertaining the power supply noise of the reference voltage generation circuit.
Sampling and Holding Control Depending on Activation/Deactivation of Circuit Serving as Noise Source In paragraph 2, the sampling and holding control circuit (70, 70A) instructs the sampling and holding circuit to perform the holding operation of the reference voltage in an activation period of a predetermined operation of the first circuit unit, and instructs the sampling and holding circuit to perform the sampling operation of the reference voltage in a deactivation period of the predetermined operation.

According to this, attention is focused on an operation having a large amount of current consumption in the first circuit unit, and thus it is possible to estimate a required timing margin or the like in advance, and to improve the accuracy of preventing the spread of a fluctuation in reference voltage.
Memory and Access Control Circuit In paragraph 4, the first circuit unit is a memory (31) that stores display data, and the second circuit units include a display electrode driving circuit (10cct, 11cct) that drives a scanning electrode and a signal electrode for display by a driving voltage generated using the reference voltage. The sampling and holding control circuit (70A) is a logic circuit that controls access to the memory, and the activation period of the predetermined operation is a period of access of the logic circuit to the memory.

According to this, even in case that the memory access such as the storage of the display data occurs in asynchronization with the display operation of the display electrode driving circuit, a fluctuation in reference voltage does not spread to the display electrode driving circuit, and thus it is possible to prevent a situation in which a display state deteriorates locally due to the power supply noise of the reference voltage generation circuit.
Sampling and Holding Control According to Non-Display/Display Period A semiconductor device (1, 1A) includes a first circuit unit (20, 30, 3, 1, 32), a reference voltage generation circuit

(21) that generates a reference voltage (Vref), a sampling and holding circuit (40) of the reference voltage, a sampling and holding control circuit (30) that controls the sampling and holding circuit, and a plurality of second circuit units (10cct, 11cct, and 12cct) that operate by inputting the reference voltage sampled and held by the sampling and holding circuit. The second circuit units include a display electrode driving circuit (10cct, 11cct) that generates a plurality of driving voltages for driving a scanning electrode and a signal electrode for display by a driving voltage generated using the reference voltage. The sampling and holding control circuit instructs the sampling and holding circuit to perform a holding operation of the reference voltage in a display period in which the scanning electrode and the signal electrode are driven, and instructs the sampling and holding circuit to perform a sampling operation of the reference voltage in a non-display period.

According to this, even in case that power supply noise is generated in the reference voltage generation circuit due to the influence of a large consumption current consumed by the display driving in the display period, the display electrode driving circuit is not likely to be influenced by a fluctuation in reference voltage caused by the noise.

Application to Semiconductor Device that Performs Display Control and Touch Detection Control In paragraph 6, the second circuit units further include a touch detection control circuit (12cct) that controls driving and touch detection of a touch panel in the non-display period by a voltage generated using the reference volt age.

According to this, even in case that power supply noise is generated in the reference voltage generation circuit due to the influence of a large consumption current consumed by the display driving in the display period, the touch detection control circuit is not likely to be influenced by a fluctuation in reference volt age caused by the noise, and thus high touch detection accuracy is guaranteed.

Sampling and Holding Control of Vref by Detecting Operation of Noise Source Circuit A semiconductor device (1, 1A) includes a first circuit block (13) that uses a first power supply (Vref) or a power supply (Lvcc) obtained by stepping down the first power supply, and a plurality of second circuit blocks (10, 11, and 12) that use a power supply (Vsp, Vsn, Vci, Vcl) having a voltage higher than that of the first power supply in absolute value. The first circuit blocks include a reference voltage generation circuit (21) that generates a reference volt age. The second circuit blocks include a sampling and holding circuit (40) of the reference voltage, and operate using a reference voltage sampled and held by their own sampling and holding circuit. The first circuit block further includes a logic circuit (70, 70A) that instructs the sampling and holding circuit to perform a holding operation of the reference voltage in an activation period of its own predetermined internal circuit, and instructs the sampling and holding circuit to perform a sampling operation of the reference voltage in a deactivation period of the internal circuit.

According to this, attention is focused on an internal circuit operation having a large amount of current consumption in the first circuit block, and thus the sampling and holding circuit of the second circuit blocks holds the reference voltage before fluctuation in the activation period of the internal circuit operation. Thereby, the second circuit blocks can continuously use the reference voltage before fluctuation due to the power supply noise of the reference voltage generation circuit. Therefore, it is possible to suppress an adverse influence on the second circuit blocks due to the reference voltage fluctuated by the power supply noise.

Particularly, attention is focused on an operation having a large amount of current consumption in the first circuit block, and thus it is possible to estimate a required timing margin or the like in advance, and to improve the accuracy of preventing the spread of a fluctuation in reference voltage. In addition, since the plurality of second circuit blocks are not required to be individually provided with the reference voltage generation circuit, it is possible to reduce the time and effort of a reduction in the scale of the circuit and trimming adjustment for the reference voltage generation circuit. Further, in case that the power supplies are different from each other, power supply noise is not primarily propagated between the power supplies, and thus the state can also be guaranteed by the common use of the reference voltage.

Sampling and Holding Control According to Memory Non-Access/Memory Access

In paragraph 8, the predetermined internal circuit is a memory (31), and the logic circuit includes an access control circuit (70A) that accesses the memory in multiple bits in parallel. The activation period is a period of write access of the logic circuit to the memory.

According to this, even in case that the memory access occurs in asynchronization with the operation of the second circuit blocks, a fluctuation in reference voltage does not spread to the second circuit blocks, and thus it is possible to prevent a situation in which the operation state of the second circuit blocks deteriorates locally due to the power supply noise of the reference voltage generation circuit.

Diversion of Write Enable Signal to Sampling and Holding Control

In paragraph 9, the logic circuit supplies a write enable signal (71A) for the memory to the second circuit blocks. The sampling and holding circuit performs the holding operation of the reference voltage in an enable period of the write enable signal, and performs the sampling operation of the reference voltage in a disable period of the write enable signal.

According to this, the write enable signal primarily included as a memory access control signal is diverted, and thus it is possible to easily realize the sampling and holding control of the sampling and holding circuit.

Reference Voltage Generation Circuit that Supplies Reference Voltage to Power Supply Regulator In paragraph 9, a boost regulator (50) that inputs and boosts an external power supply and generates a boost power supply as a power supply having a voltage higher than that of the first power supply in absolute value is further included, and the second circuit blocks use the boost power supply generated by the boost regulator in an operation power supply. According to this, even in case that the second circuit blocks use the boost power supply, it is possible to prevent an adverse influence from occurring due to the power supply noise of the reference voltage generation circuit.

Sampling/Holding Control According to Boost Operation Period/Non-Boost Operation Period of Boost Regulator In paragraph 11, the logic circuit further instructs the sampling and holding circuit to perform the holding operation of the reference voltage in a boost operation period of the boost regulator even during the disable period.

The power supply noise caused by a large current consumption due to the boost operation of the boost circuit spreads to the reference voltage generation circuit, and thus it is possible to prevent a concern of an adverse influence occurring in the second circuit block from being caused.

Sampling and Holding Control of Vref by Detecting Power Supply Noise

A semiconductor device includes a first circuit block that uses a first power supply or a power supply obtained by stepping down the first power supply, and a plurality of second circuit blocks that use a power supply having a voltage higher than that of the first power supply in absolute value. The first circuit block includes a reference voltage generation circuit (21) that generates a reference voltage and a sampling and holding control circuit (60). The second circuit blocks include a sampling and holding circuit (40) of the reference voltage, and operate using a reference voltage sampled and held by their own sampling and holding circuit. The sampling and holding control circuit determines whether a predetermined power supply fluctuation occurs in a power supply of the reference voltage generation circuit, instructs the sampling and holding circuit to perform the holding operation of the reference voltage in a predetermined period with respect to the fluctuation in case that the predetermined power supply fluctuation is detected, and instructs the sampling and holding circuit to perform the sampling operation of the reference voltage in case that the power supply fluctuation is not detected.

According to this, since the sampling and holding circuit holds the reference voltage before fluctuation by directly ascertaining the power supply noise of the reference voltage generation circuit and detecting a predetermined power supply fluctuation, the second circuit blocks can continuously use the reference voltage before fluctuation due to the power supply noise of the reference voltage generation circuit. Therefore, it is possible to suppress an adverse influence on the second circuit blocks due to the reference voltage fluctuated by the power supply noise. In addition, since the plurality of second circuit blocks are not required to be individually provided with the reference voltage generation circuit, it is possible to reduce the time and effort of a reduction in the scale of the circuit and trimming adjustment for the reference volt age generation circuit. Further, in case that the power supplies are different from each other, power supply noise is not primarily propagated between the power supplies, and thus the state can also be guaranteed by the common use of the reference voltage.

Convergence of Sampling and Holding Control According to Power Supply Fluctuation In paragraph 13, the sampling and holding control circuit instructs the sampling and holding circuit to perform the holding operation of the reference voltage in a period determined by a predetermined time constant with respect to the fluctuation in case that the predetermined power supply fluctuation is detected.

According to this, even in case that a slight power supply fluctuation occurs, it is possible to guarantee the convergence of control. Further detailed description of the embodiments A further detailed description of the embodiments will be given below.

LCD Controller LSI 1

FIG. 1 illustrates an LCD controller LSI1 as an example of a semiconductor device. A liquid crystal display panel 2 and a touch panel 3 are shown in FIG. 1 together with the LCD controller LSI1. The liquid crystal display panel 2 constitutes a display frame in a state where pixels formed using, for example, TFT type transistors are disposed in a matrix. Although not particularly limited, the touch panel 3 has an in-cell structure in which the touch panel is formed integrally with the liquid crystal display panel 2, and is configured such that a touch detection frame is formed in a state of overlapping with the display frame, thereby allowing touch detection to be made depending on a difference in capacitance.

The LCD controller LSI1 shown in the drawing includes a circuit (display scanning electrode driving circuit) 10 that generates a driving voltage for driving a display scanning electrode of the liquid crystal display panel 2 to drive the display scanning electrode, a circuit (signal electrode driving circuit) 11 that generates a driving voltage for driving a signal electrode of the liquid crystal display panel 2 to drive the signal electrode, and a circuit (touch detection control circuit) 12 that generates a voltage for performing the driving and touch detection of the touch panel 3 to control the touch panel. The display scanning electrode driving circuit 10, the signal electrode driving circuit 11, and the touch detection control circuit 12 are used as an example of a circuit block. The display scanning electrode means a gate line connected to a gate of a pixel transistor, and further means a common electrode line of the pixel transistor. The signal electrode means a source line connected to a source of the pixel transistor.

A system interface 20 receives a display command, a write command, a touch detection command and the like from a host processor not shown in the drawing, receives display data, and outputs touch detection data to the host processor.

The display command is supplied to a display control circuit 30. The display control circuit 30 stores the display data supplied to the system interface 20 in a display frame memory 31 in response to the write command. The display control circuit 30 reads out the display data from the display frame memory 31 in response to the display command to transmit the read-out display data to a latch circuit 32, and causes the display scanning electrode driving circuit 10 to drive the display scanning electrode of the liquid crystal display panel 2 in accordance with a vertical synchronous timing. Concurrently, the displays control circuit 30 causes the signal electrode driving circuit 11 to drive the signal electrode using the display data of the latch circuit 32.

The touch detection command is supplied to the touch detection control circuit 12. The touch detection control circuit 12 detects a signal according to a change in capacitance at the time of sequentially driving the scanning line of the touch panel 3, and determines the presence or absence of a touch at each detection position in the touch detection frame by comparing a detection signal with a threshold. Data of determination results is provided to the host processor through the system interface 20 in units of the touch detection frame.

The power supply of the LCD controller LSI1 differs depending on its circuit portion.

As external power supplies, although not particularly limited, the LCD controller LSI1 inputs a high-potential power supply IOVCC and a low-potential power supply GND for external input and output, a high-potential power supply VCL, a low-potential power supply AGND and a high-potential negative power supply VCL for display scanning electrode driving, a high-potential power supply VSP and a high-potential negative power supply VSN for signal electrode driving, and a high-potential power supply AVDD and a low-potential power supply SAGND for touch detection.

The power supplies IOVCC and GND for external input and output are supplied to internal power supply wirings as IOVCC and Gnd, and are delivered from the wirings to the system interface 20, the reference voltage generation circuit 21, and the logic circuit power supply regulator 23. For example, IOVCC is 1.8 V, and Gnd is 0 V.

The reference voltage generation circuit 21 generates a reference voltage Vref of approximately 1.2 to 1.3 V from the power supplies IOVCC and GND, using, for example, a silicon bandgap, or using a difference between threshold voltages of an n-channel type MOS transistor and a p-channel type MOS transistor.

The logic circuit power supply regulator 23 generates a high-potential power supply Lvcc for a logic circuit from the power supplies IOVCC and GND, using the reference voltage Vref as a reference voltage. The power supply Lvcc is, for example, 0.8 V. The power supply Lvcc is supplied to the display control circuit 30, the display frame memory 31, and the latch circuit 32 through power supply wirings together with the low-potential power supply Gnd.

The high-potential power supply VCI, the low-potential power supply AGND and the high-potential negative power supply VCL for display scanning electrode driving are supplied to internal power supply wirings as Vci, AGND, Vcl, and are supplied from the wirings to the display scanning electrode driving circuit 10. For example, Vci is 3.0 V, Vcl is −3.0 V, and AGND is 0 V. The display scanning electrode driving circuit 10 generates a plurality of positive and negative driving voltages for driving the scanning electrode of the liquid crystal display panel by amplifying the power supplies Vci and Vcl using the reference voltage Vref as a reference voltage, and drives the scanning electrode using the generated driving voltages.

The high-potential power supply VSP and the high-potential negative power supply VSN for signal electrode driving are supplied to internal power supply wirings as Vsp and Vsn, and are supplied from the wirings to the signal electrode driving circuit 11. For example, Vsp is 6.0 V, Vsn is −6.0 V, and Agnd is 0 V. The signal electrode driving circuit 11 generates a plurality of gradation voltage levels from the power supplies Vsp and Vsn using the reference voltage Vref as a reference voltage, and drives the signal electrode of the liquid crystal display panel 2 using the generated gradation voltages. The signal electrode driving circuit 11 drives the signal electrode of the liquid crystal display panel 2 using the gradation voltage selected for each pixel in response to the display data.

The high-potential power supply AVDD and the low-potential power supply Sagnd for touch detection are supplied to internal power supply wirings as Avdd and Sagnd, and are delivered from the wirings to the touch detection control circuit 12. For example, Avdd is 5.0 V, and Sagnd is 0 V. Amplification from power supplies Avdd and Sagnd to required voltage levels is performed using the reference voltage Vref of the touch detection control circuit 12 as a reference voltage and a scanning driving voltage and a touch detection voltage of the touch panel are generated. Touch detection control is performed using the generated scanning driving voltage and the touch detection voltage.

The reference voltage Vref is generated in the reference voltage generation circuit 21 which is common to the display scanning electrode driving circuit 10, the signal electrode driving circuit 11, and the touch detection control circuit 12, and is supplied to each of the circuits 10, 11, and 12. The power supply of the reference voltage generation circuit 21 is IOVCC and Gnd, and power supply noise of the power supplies Iovcc and Gnd influences the reference voltage Vref. For example, the flow of a large consumption current from the wiring of the power supply Lvcc to the wiring of Gnd in case that the display control circuit 30 writes the display data in the display frame memory 31 spreads to the power supplies IOVCC and Gnd, and thus it is considered that power supply noise is generated in the reference voltage generation circuit 21. In addition, in case that a large consumption current flows from the wiring of the power supply Iovcc to the wiring of Gnd by the system interface 20 outputting the touch detection data of the touch detection frame to the outside, it is considered that power supply noise is generated in the reference voltage generation circuit 21 similarly to the above case.

In order not to use the fluctuated reference voltage Vref in the display scanning electrode driving circuit 10, the signal electrode driving circuit 11, and the touch detection control circuit 12 that generate voltages using the reference voltage Vref as a reference voltage, each of the circuits has a sampling and holding circuit 40, and the reference voltage is held in advance in case that a fluctuation in the reference voltage Vref is caused.

Figure 2:
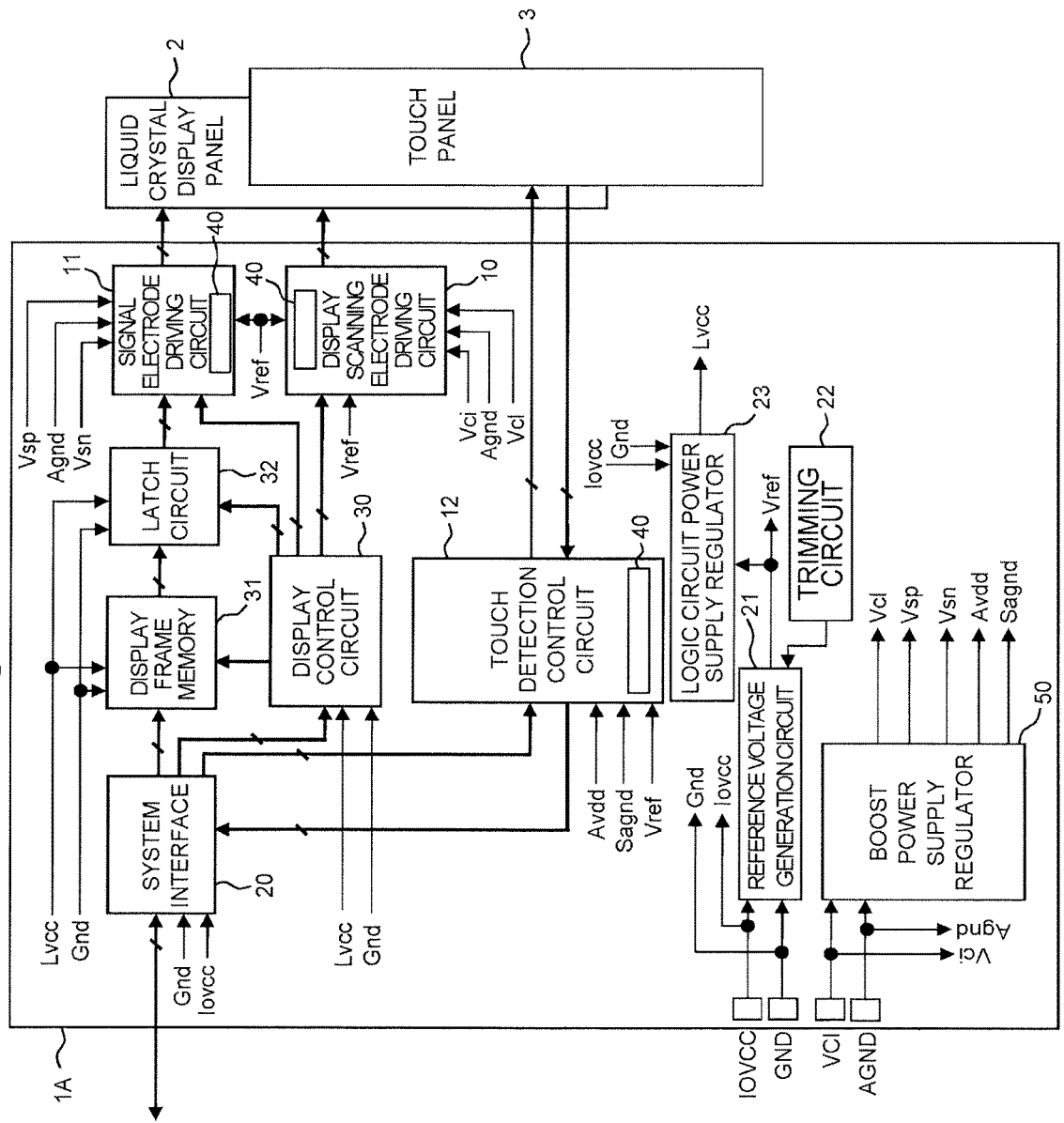
FIG. 2 is a block diagram illustrating another LCD controller.

FIG. 2 shows an example of another LCD controller 1A. A difference from FIG. 1 is that, as external power supplies, the high-potential power supply IOVCC and the low-potential power supply GND for external input and output, and the high-potential power supply VCI and the low-potential power supply Agnd for display scanning electrode driving are set to inputs, and that a boost power supply regulator 50 using the high-potential power supply VCI and the low-potential power supply Agnd as operation power supplies is newly adopted accordingly. In this case, the boost power supply regulator 50 uses the high-potential power supply Vci and the low-potential power supply Agnd as operation power supplies, generates the high-potential negative power supply Vci, the high-potential power supply Vsp, the high-potential negative power supply Vsn, the high-potential power supply Avdd for touch detection, and the low-potential power supply Sagnd, and supplies these power supplies to each portion.

Even in this case, the same is true that, in order not to use the fluctuated reference voltage Vref in the display scanning electrode driving circuit 10, the signal electrode driving circuit 11, and the touch detection control circuit 12 that generate voltages using the reference voltage Vref as a reference voltage, each of the circuits has the sampling and holding circuit 40, and that the reference voltage is held in advance in case that a fluctuation in the reference voltage Vref is caused.

It is also considered that, although not shown in the drawing, the system interface 20, the display control circuit 30, the display frame memory 31, and the latch circuit 32 use the power supplies Iovcc and Gnd as operation power supplies. Even in this case, it goes without saying that, in order not to use the fluctuated reference voltage Vref in the display scanning electrode driving circuit 10, the signal electrode driving circuit 11, and the touch detection control circuit 12, each of the circuits has the sampling and holding circuit 40, and that the reference voltage is held in advance in case that a fluctuation in the reference voltage Vref is caused.

Sampling and Holding Control by Detecting Power Supply Noise

Figure 3:
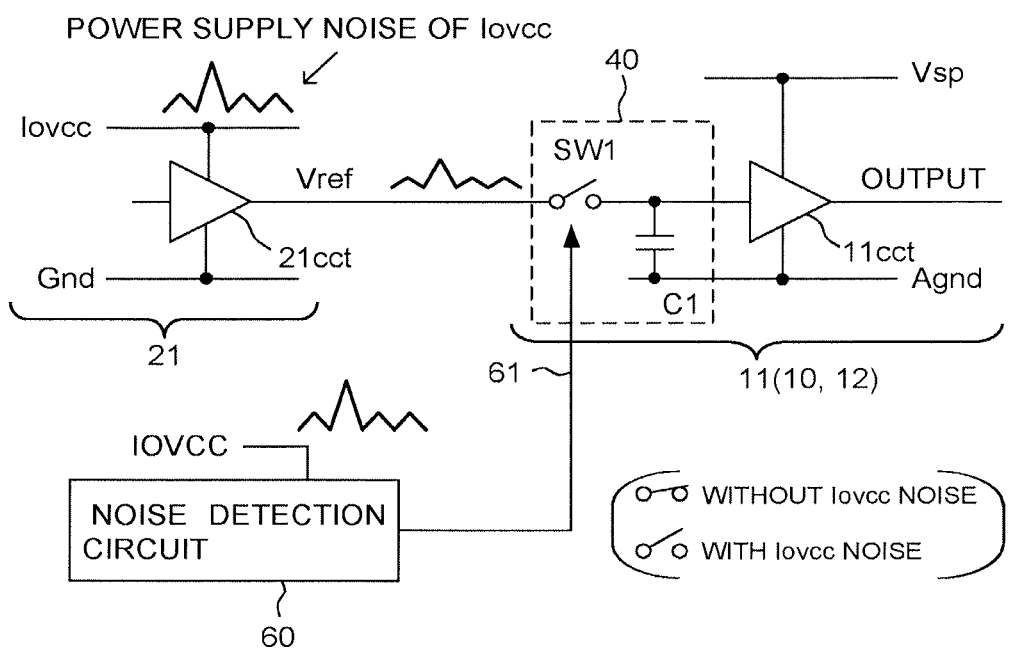
FIG. 3 is a diagram illustrating, in principle, a configuration in which power supply noise is detected and sampling and holding control is performed.

FIG. 3 illustrates, in principle, a configuration in which power supply noise is detected and sampling and holding control is performed. Here, the sampling and holding circuit of the signal electrode driving circuit 11 is used as an example. The sampling and holding circuit 40 is constituted by a switch SW1 disposed in a path in which the reference voltage Vref is supplied from the reference voltage generation circuit 21 and a capacitor C1 disposed between the subsequent stage of the switch SWI and the low-potential power supply Agnd. Here, 11*cct* serves as a circuit unit (signal electrode driving unit) except for the sampling and holding circuit 40 with respect to the signal electrode driving circuit 11 as a circuit block. In addition, 21*cct* refers to a circuit configuration of the reference voltage generation circuit 21 collectively.

A noise detection circuit 60 means a sampling and holding control circuit, and determines whether power supply noise of the high-potential power supply lovcc, that is, power supply noise of the reference voltage generation circuit falls within or falls outside a predetermined range. In case that the power supply noise falls within the predetermined range, the switch SW1 of the sampling and holding circuit 40 is turned on by a sampling and holding control signal 61 to give an instruction for a sampling operation of the reference voltage Vref. In case that the power supply noise exceeds the predetermined range, the switch SW1 of the sampling and holding circuit 40 is turned off to give an instruction for a holding operation of the reference voltage Vref. It is preferable that the noise detection circuit 60 be disposed in the vicinity of the reference voltage generation circuit 21.

The reference voltage Vref is held by the sampling and holding circuit 40 with the switch SW1 open at a timing when noise is generated in the high-potential power supply lovcc, and thus the reference voltage of the next-stage circuit 11*cct* can hold a stable voltage which is not influenced by the noise of the power supply lovcc. The same is true in not only the signal electrode driving circuit 11 but also the display scanning electrode driving circuit 10 and the touch detection control circuit 12. Even in case that noise is generated in the power supply lovcc due to the influence of operations of other circuits such as the system interface circuit 20 and the display frame memory 31, circuit scan be brought into operation by the stable reference voltage Vref which is not influenced by the noise in the signal electrode driving circuit 11, the display scanning electrode driving circuit 10 and the touch detection control circuit 12 which operate by delivering the reference volt age Vref.

In addition, since the stable reference volt age Vref which is not influenced by the power supply noise can be delivered between different power supply blocks as mentioned above, a voltage generated in one reference voltage circuit 21 is delivered between the blocks without individually mounting the reference voltage generation circuit 21 for each power supply block, and thus the scale of the reference voltage circuit 21 can be kept small. Even in case that shipping adjustment in the trimming circuit 22 and the like is required, trimming adjustment is performed collectively on reference voltages of a plurality of blocks, and thus a burden on the manufacturing cost of the LCD controller LSI can be minimized.

Figure 4:
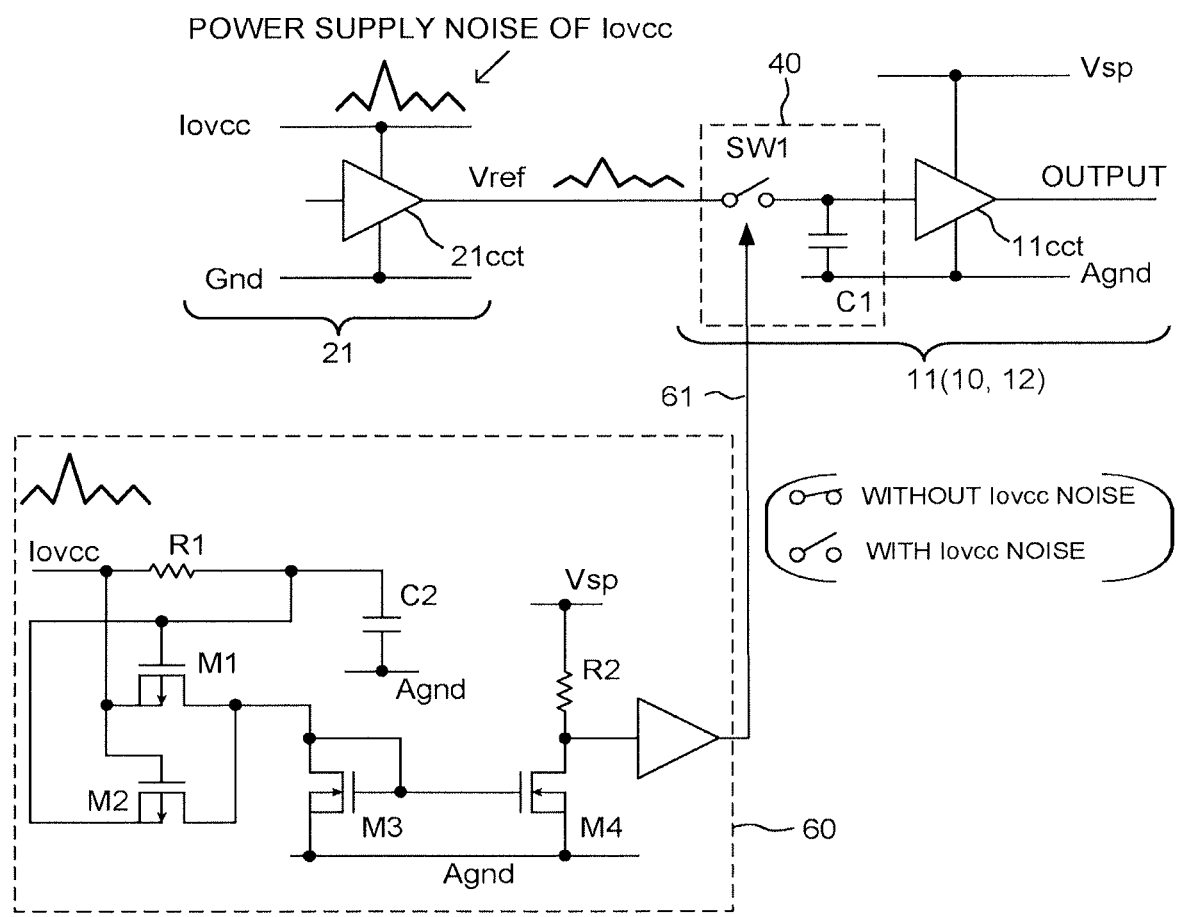
FIG. 4 is a circuit diagram illustrating a specific example of a noise detection circuit.

FIG. 4 shows a specific example of the noise detection circuit 60. In FIG. 4, a resistor R1 and a capacitor C2 are disposed in series between the high-potential power supply lovcc and the low-potential power supply Agnd, and a p-channel type MOS transistor M1 that causes a current to flow in case that a potential difference is formed between both ends of the resistor R1 due to a rise in the high-potential power supply lovcc and a p-channel type MOS transistor M2 that causes a current to flow in case that a potential difference is formed between both ends of the resistor R1 due to a drop in the high-potential power supply lovcc are provided. A current flowing through the MOS transistor M1 or M2 controls the conductance of an n-channel type MOS transistor M4 through an n-channel type MOS transistor M3, and generates the sampling and holding control signal 61 in accordance with a voltage of a coupling node between the MOS transistor M4 and a resistor R2 depending on the conductance of the MOS transistor M4. The reference voltage Vref is sampled by turning on the switch SW1 at a high level of the sampling and holding control signal 61, and the reference voltage Vref is held by turning off the switch SW1 at a low level. A hold period is a time determined by time constants of the resistor R1 and the capacitor C2.

Figure 5:
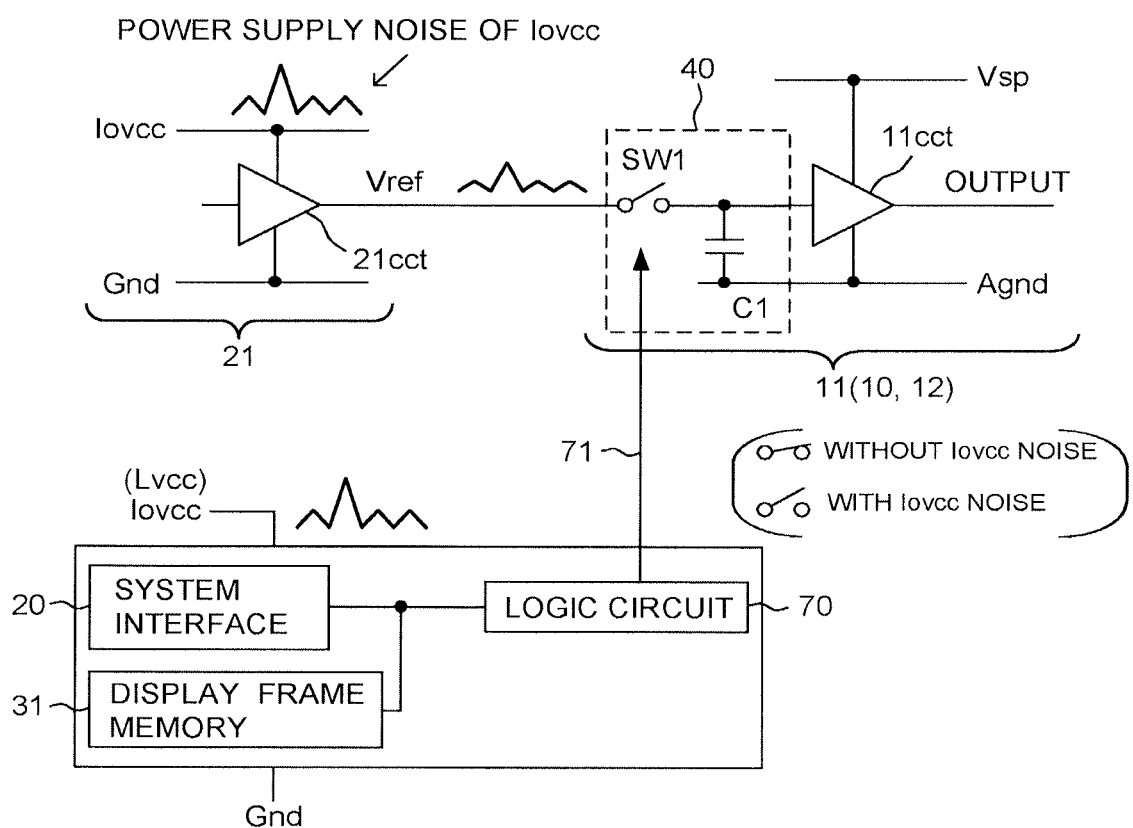
FIG. 5 is a diagram illustrating, in principle, a configuration in which sampling and holding control is performed depending on activation/deactivation of a circuit serving as a noise source.

Sampling and Holding Control Depending on Activation/Deactivation of Circuit Serving as Noise Source FIG. 5 illustrates, in principle, a configuration in which sampling and holding control is performed depending on the activation/deactivation of a circuit serving as a noise source. Here, the sampling and holding circuit of the signal electrode driving circuit 11 is used as an example. The sampling and holding circuit 40 is constituted by a switch SW1 disposed in a path in which the reference voltage Vref is supplied from the reference voltage generation circuit 21 and a capacitor C1 disposed between the subsequent stage of the switch SW1 and the low-potential power supply Agnd. Here, 11*cct* refers to a circuit configuration of the signal electrode driving circuit 11 except for the sampling and holding circuit 40 collectively, and 21*cct* refers to a circuit configuration of the reference voltage generation circuit 21 collectively.

Here, a logic circuit 70 as a sampling and holding control circuit that performs sampling and holding control instructs the sampling and holding circuit 40 to perform the sampling operation of the reference voltage Vref through a control signal 71 with respect to an operation of the LCD controller LSI1 (1A) consuming a current in a range in which the power supply noise of the reference voltage generation circuit Vref falls within a predetermined range, and instructs the sampling and holding circuit 40 to perform the holding operation of the reference voltage Vref through the control signal 71 with respect to the operation of the LCD controller LSI1 (1A) assumed to consume a current as the power supply noise exceeds the predetermined range.

Since a response is made by predicting an operation in which undesired power supply noise is generated in advance rather than a case where a response is made by detecting actual power supply noise, it is possible to estimate a required timing margin or the like in advance, and to improve the accuracy of preventing the spread of the fluctuated reference voltage Vref.

Figure 6:
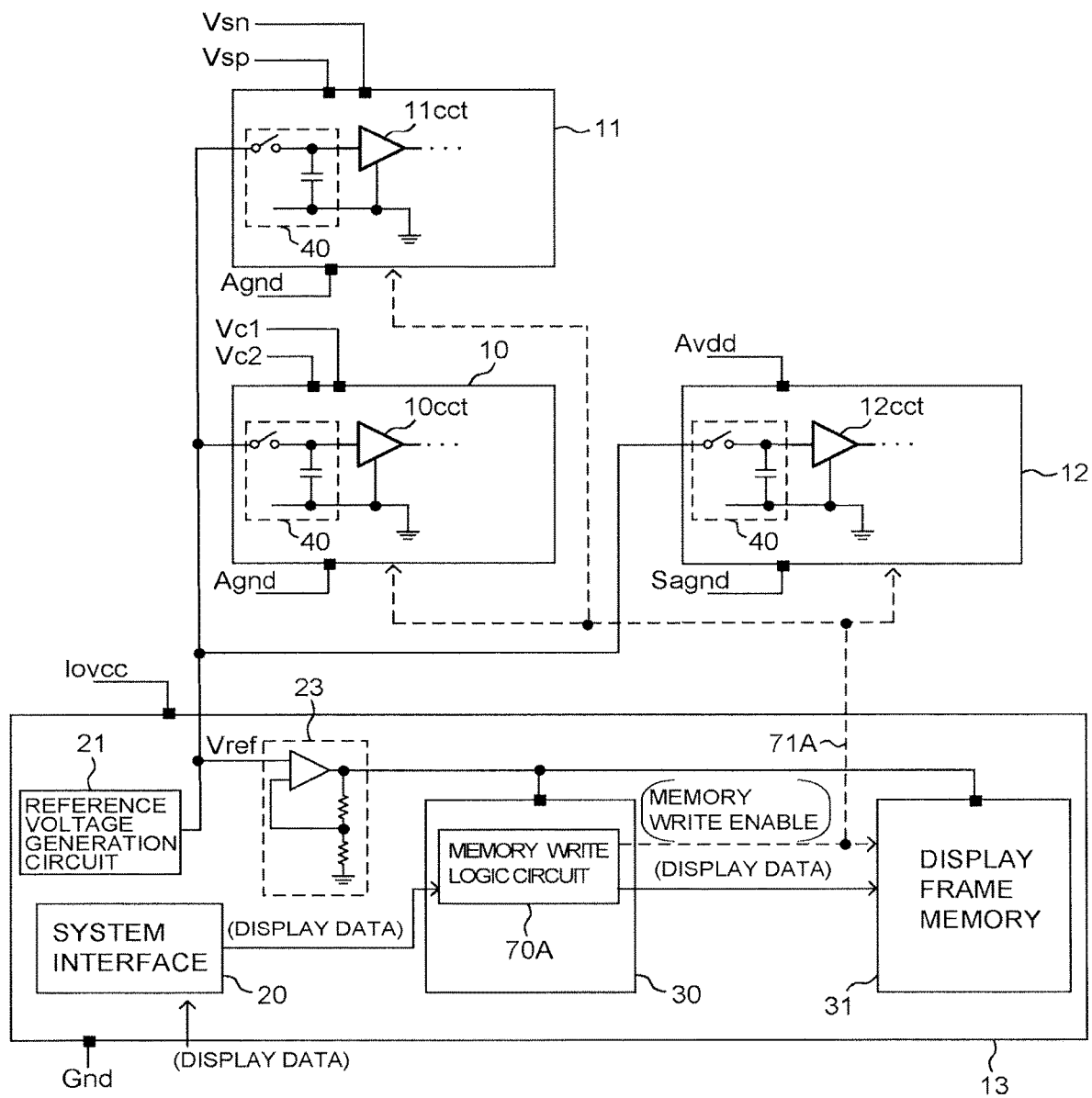
FIG. 6 is a block diagram illustrating a specific example of sampling and holding control performed by a logic circuit.

FIG. 6 shows a specific example of sampling and holding control performed by the logic circuit. In FIG. 6, 13 is an example of a first circuit block operated using the power supply lovcc and the step-down power supply Lvcc obtained by stepping down the power supply lovcc in the logic circuit power supply regulator 23. On the other hand, the display scanning electrode driving circuit 10, the signal electrode driving circuit 11, and the touch detection control circuit 12 are positioned as an example of a second circuit unit which is operated using a power supply having a voltage higher than that of the power supply lovcc in absolute value. In FIG. 6, 12*cct* serves as a circuit unit (touch detection control unit) except for the sampling and holding circuit 40 with respect to the touch detection control circuit 12 as a circuit block. Similarly, 10*cct* serves as a circuit unit (display scanning electrode driving unit) except for the sampling and holding circuit 40 with respect to the display scanning electrode driving circuit 10 as a circuit block.

Here, a memory write logic circuit 70A included in the display control circuit 30 is used as the logic circuit 70. The memory write logic circuit 70A performs write control on the display frame memory 31 constituted by, for example, a SRAM and the like in response to an access command from the host processor. The memory write logic circuit 70A enables (sets to be at an activation level) a write enable signal 71A whenever display data is written in the display frame memory 31. In case that the write enable signal 71A is enabled, the display frame memory 31 performs an operation for writing the supplied display data in a memory array in accordance with a write address. In the writing operation, display data of multiple bytes is written in parallel by operating a plurality of write amplifiers and the like in parallel. In this writing operation, it is expected that a large consumption current flows through a power supply line, and that power supply noise is generated in the power supplies IOVCC and Gnd.

Figure 7:
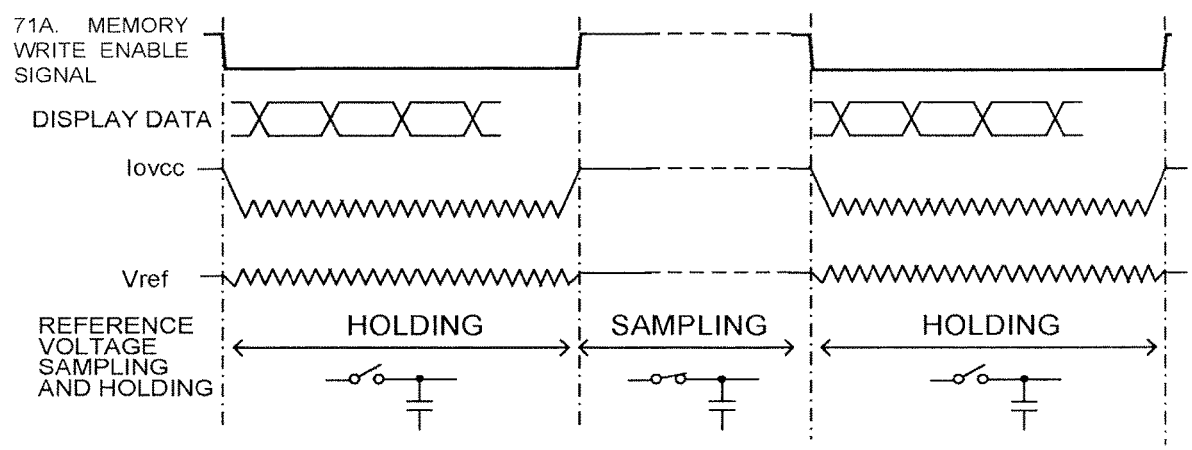
FIG. 7 is a timing diagram illustrating operation timings of FIG. 6.

In this case, the write enable signal 71A is diverted as a sampling and holding control signal of the sampling and holding circuit 40. The sampling and holding circuit 40 is instructed to perform a sampling operation depending on a disable (deactivation) level of the write enable signal 71A, and the sampling and holding circuit 40 is instructed to perform a holding operation depending on an enable level of the write enable signal 71A. FIG. 7 illustrates its operation timing. Thereby, even in case that the reference voltage Vref fluctuates due to the writing operation of the display data in the display frame memory 31, the display scanning electrode driving circuit 10, the signal electrode driving circuit 11, and the touch detection control circuit 12 are not influenced by the fluctuation. Therefore, even in case that the writing of the display data is requested from the host processor in asynchronization with a display operation, it is possible to prevent a situation in which a display screen is locally disordered from occurring. In short, it is possible to prevent a situation in which the display screen becomes disordered suddenly and discontinuously due to the reference voltage Vref fluctuating in asynchronization with the display operation.

Sampling and Holding Control According to Non-Display/Display Period

Figure 8:
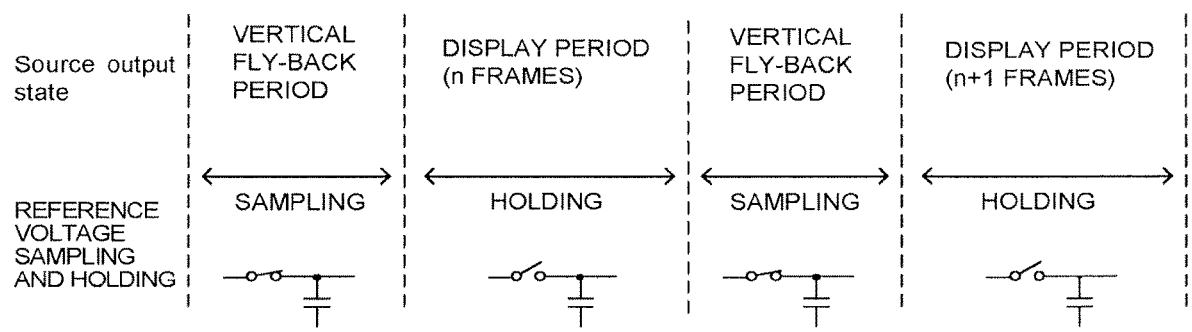
FIG. 8 is a diagram illustrating a principle of sampling and holding control focused on a display period and a non-display period.

FIG. 8 shows a principle of sampling and holding control focused on a display period and a non-display period. In source outputs for liquid crystal display in the signal electrode driving circuit 11, since various voltages conforming to a display image in a display period in which the liquid crystal display panel 2 is driven are output, power supply noise is likely to be generated due to an extreme change in the amplitude of an output voltage, and thus there is concern of an influence on the reference voltage generation circuit. On the other hand, during the non-display period, such as a vertical fly-back period, when the liquid crystal display panel 2 is not driven, a constant voltage is output for each polarity of a positive electrode and a negative electrode, or a state of an output of the power supply Gnd or high-impedance (Hi-z) is set. Therefore, the power supply noise is not likely to be generated, and thus there is no influence on the reference voltage generation circuit. Turning attention to this point, the display control circuit 30 is configured such that the sampling and holding circuit 40 is set to be in a sampling state in the non-display period such as a vertical fly-back period and set to be in a holding state in the display period to thereby supply a reference voltage having small noise. That is, even in case that power supply noise is generated in the reference voltage generation circuit 21 due to the influence of a large consumption current consumed by the display driving in the display period, the display scanning electrode driving circuit 10, the signal electrode driving circuit 11, and the touch detection control circuit 12 are not influenced by a fluctuation in reference voltage caused by the noise. An aspect of the sampling and holding control according to the non-display/display period may be used singly, but can also be used together with control according to a detection result of the above power supply fluctuation and control according to the possibility of the above memory write access. In case that instructions compete against each other when a control method is mixed, priority may be placed on a holding instruction.

Concurrently, the touch detection control circuit 12 controls the driving and touch detection of the touch panel 3 in the non-display period such as a vertical fly-back period. Therefore, even in case that power supply noise is generated in the reference voltage generation circuit 21 due to the influence of a large consumption current consumed by the display driving in the display period, the touch detection control circuit 12 is not likely to be influenced by a fluctuation in the reference voltage Vref caused by the noise, and thus high touch detection accuracy is guaranteed.

Figure 9:
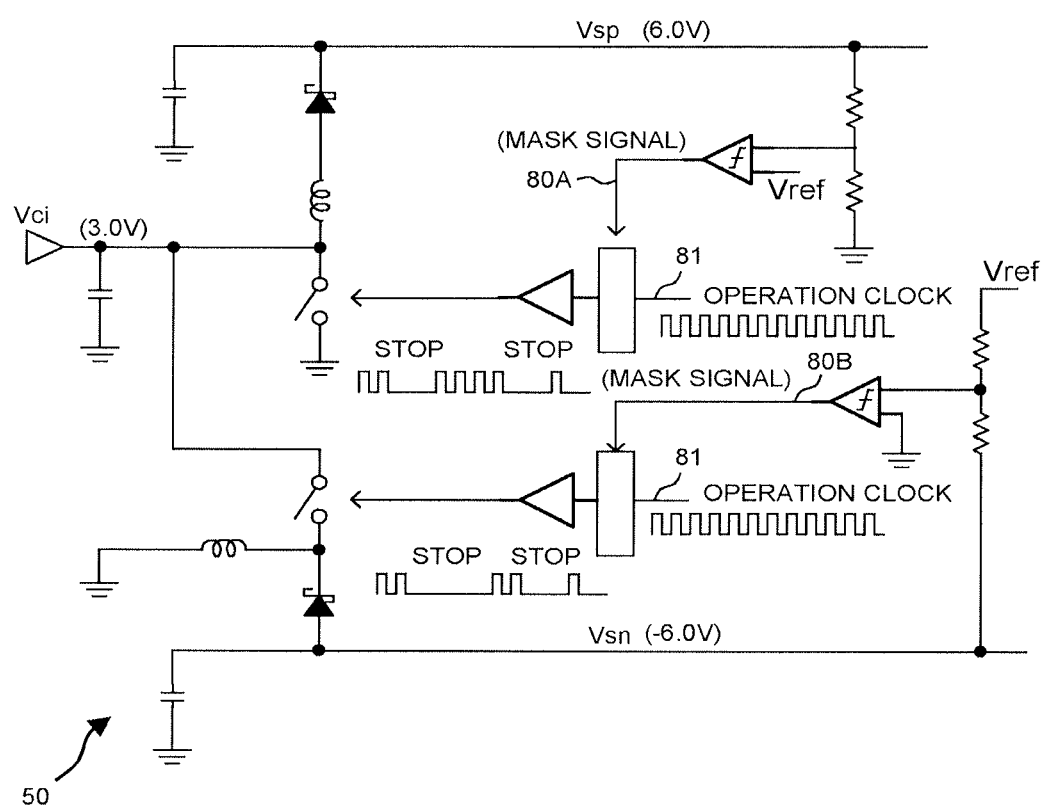
FIG. 9 is a circuit diagram illustrating an example of a boost power supply regulator of FIG. 2.

Sampling and Holding Control According to Boost Operation Period/Non-Boost Operation Period of Boost Regulator FIG. 9 shows an example of a boost power supply regulator 50 of FIG. 2. Here, a circuit example is shown in which the high-voltage positive power supply Vsp and the high-voltage negative power supply Vsn are boosted on the basis of the external power supply VCI. An operation clock 81 is stopped by mask signals 80A and 80B in a state where a load current is small together with the power supplies Vsp and Vsn and a voltage drop does not occur. Here, by diverting the mask signals 80A and 80B as sampling and holding control signals, the sampling and holding circuit 40 is instructed to perform the holding operation while the boost power supply regulator 50 operates, and the sampling and holding circuit 40 is instructed to perform the sampling operation while the boost power supply regulator 50 is stopped. Thereby, it is possible to avoid an influence of the power supply noise caused by the operation of the boost power supply regulator 50 on the reference voltage generation circuit 21.

An aspect of the sampling and holding control focused on the boost operation can also be used together with the control according to the detection result of the above power supply fluctuation, the control according to the possibility of the memory write access, and the control according to the display/non-display. In case that instructions compete against each other when a control method is mixed, priority may be placed on a holding instruction.

Holding Capacitor of Sampling and Holding Circuit

Figure 10:
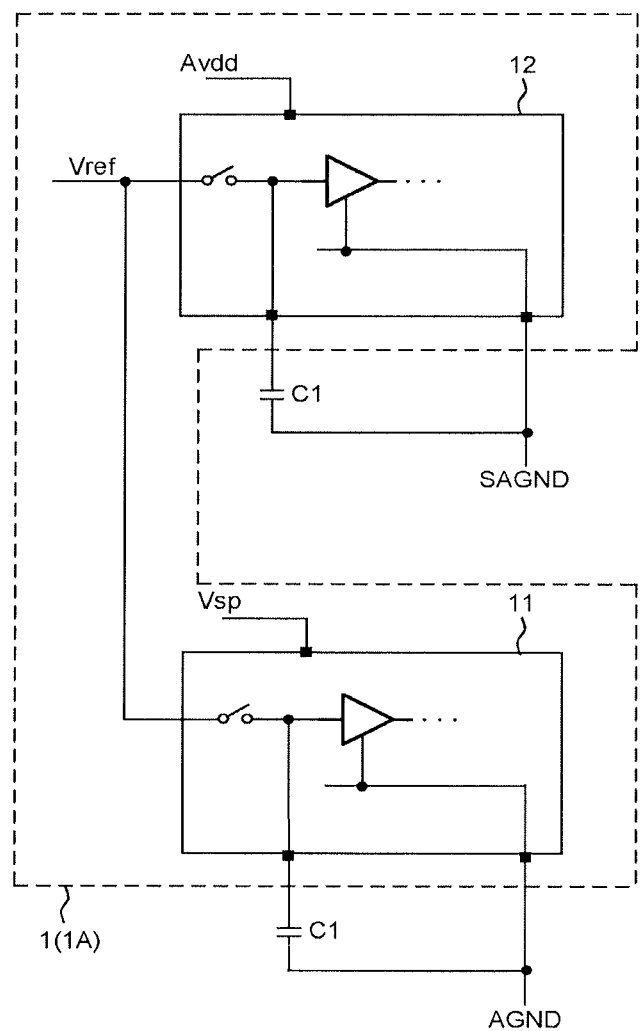
FIG. 10 is a circuit diagram illustrating a case where a capacitor of a sampling and holding circuit is externally attached and one electrode is connected to a ground power supply.
Figure 11:
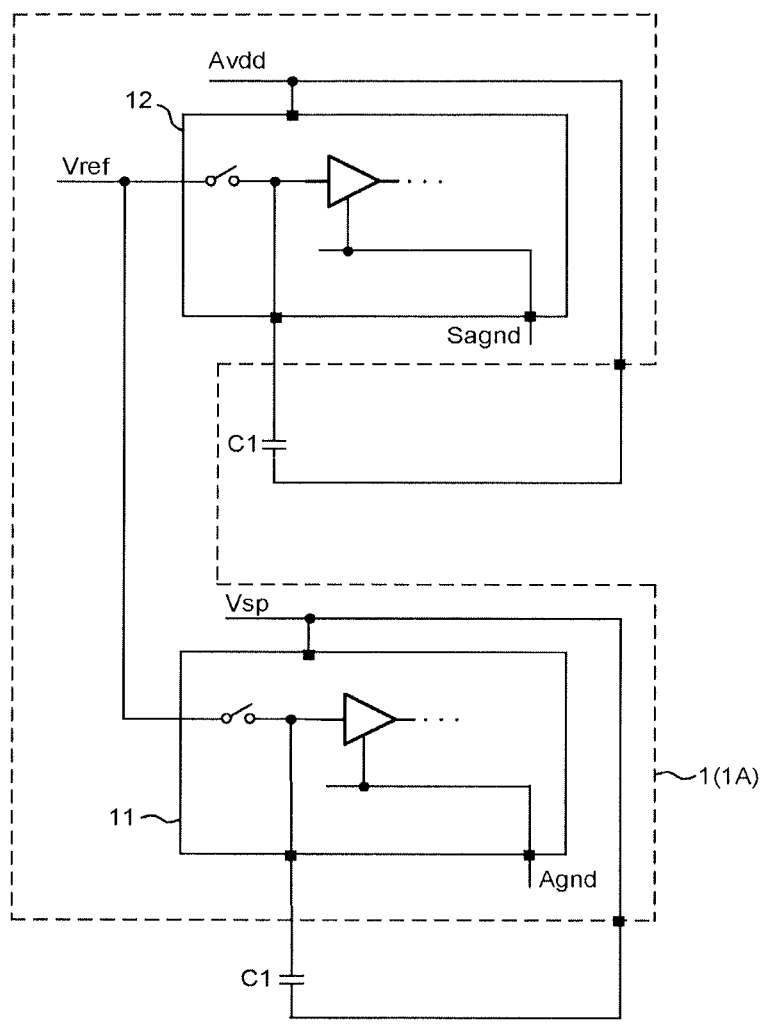
FIG. 11 is a circuit diagram illustrating a case where the capacitor of the sampling and holding circuit is externally attached and one electrode is connected to a high-voltage power supply.

The holding capacitor C1 of the sampling and holding circuit 40 may be a built-in capacitor of the semiconductor devices 1 and 1A, and may be an external capacitor of the semiconductor devices 1 and 1A as illustrated as FIGS. 10 and 11. In a case of the external capacitor, one electrode of the capacitor C1 may be connected to the external ground power supplies AGND and SAGND as shown in FIG. 10, and one electrode of the capacitor C1 may be connected to the high-voltage power supplies Vsp and Avdd as shown in FIG. 11. Particularly, the ground power supply or the high-voltage power supply which is connected to the external capacitor C1 is used as a ground power supply or a high-voltage power supply which is common to circuits supplied with the reference voltage Vref.

The present invention is not limited to the above-mentioned embodiments, and it goes without saying that various changes and modifications may be made without departing from the scope of the invention.

For example, the control according to the detection result of the power supply fluctuation and the control according to the possibility of the memory write access can be used singly, or can be used together. In the latter case, in case that instructions compete against each other, priority may be placed on a holding instruction.

The semiconductor device of the present invention is not limited to the LCD driver LSI. Even in a case of the LCD driver LSI, the device may not have the driving and detection function of the touch panel. The present invention can be widely applied to a semiconductor device having a function of generating an internal voltage using the reference voltage. The semiconductor device is not limited to a single chip, and may be a device obtained by modularizing a multi-chip.

The invention claimed is:

1. A display controller comprising:
first circuitry configured to receive display data;
a reference generator configured to generate a reference voltage;
a sample and hold configured to:
sample the reference voltage during a non-display period to generate a sampled reference voltage; and
output the sampled reference voltage during a display period; and
second circuitry communicatively coupled to the sample and hold, the second circuitry configured to drive display electrodes of a display device based on the sampled reference voltage during the display period.

2. The display controller of claim 1 further comprising:
touch circuitry comprising a second sample and hold, the touch circuitry configured to perform touch detection during the non-display period.

3. The display controller of claim 1, wherein the sample and hold comprises a capacitor and a switch configured to selectively couple and decouple the reference voltage with the capacitor; and
wherein the sample and hold is configured to:
sample the reference voltage when the switch couples the reference voltage with the capacitor; and
output the sampled reference voltage when the switch decouples the reference voltage from the capacitor.

4. A display controller comprising:
first circuitry configured to receive display data;
a reference generator configured to generate a reference voltage;
a sample and hold configured to:
sample the reference voltage based on a determination of a lack of power supply fluctuation; and
output the sampled reference voltage based on a detection of the power supply fluctuation; and
second circuitry communicatively coupled to the sample and hold, the second circuitry configured to:
drive display electrodes based on the reference voltage based on the determination that the power supply fluctuation is lacking; and
drive the display electrodes based on the sampled reference voltage based on the detection of the power supply fluctuation.

5. The display controller of claim 4, wherein:
the detection of the power supply fluctuation corresponds to a determination that the power supply fluctuation satisfies a fluctuation threshold; and
the determination of a lack of the power supply fluctuation corresponds to a determination that the power supply fluctuation does not satisfy the fluctuation threshold.

6. A display device comprising:
a display panel comprising display electrodes; and
a display driver communicatively coupled to the display panel and comprising:
first circuitry configured to receive display data;
a reference generator configured to generate a reference voltage;
a sample and hold configured to:
sample the reference voltage to generate a sampled reference voltage based on a determination that power supply noise of the reference generator satisfies a first threshold; and
output the sampled reference voltage based on a determination that the power supply noise exceeds the first threshold; and
second circuitry communicatively coupled to the sample and hold, the second circuitry configured to:
drive the display electrodes based on the reference voltage based on the determination that the power supply noise of the reference generator satisfies the first threshold; and
drive the display electrodes based on the sampled reference voltage based on the determination that the power supply noise exceeds the first threshold.

7. The display device of claim 6, wherein:
the display driver further comprises touch circuitry comprising a second sample and hold, the touch circuitry configured to: perform touch detection during a non-display period.

8. The display device of claim 6, wherein:
the display driver further comprises a boost regulator configured to boost an external power supply generating a boost power supply.

9. A method for driving display electrodes of a display, the method comprising:
receiving display data with first circuitry;
generating a reference voltage;
sampling the reference voltage to generate a sampled reference voltage during a first period;
outputting the sampled reference voltage during a second period; and
driving display electrodes based on the reference voltage during the first period; and
driving the display electrodes based on the sampled reference voltage during the second period, wherein the first period corresponds to one of a deactivation period of the first circuitry, and a non-boost period of a boost regulator, the second period corresponds to one of an activation period of the first circuitry and a boost period of the boost regulator.

10. The method of claim 9, further comprising:
performing touch sensing during a non-display period.

* * * * *